United States Patent
Zhai (10) Patent No.: US 10,340,329 B2
(45) Date of Patent: Jul. 2, 2019

(54) DISPLAY PANEL INCLUDING POWER SUPPLY COMPENSATION FILM HAVING REDUCED SHEET RESISTANCE ARRANGED ON OPPOSITE SURFACE OF SUBSTRATE FROM POWER SUPPLY LINE LAYER

(71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 15/713,691

(22) Filed: Sep. 24, 2017

(65) Prior Publication Data

US 2018/0019294 A1    Jan. 18, 2018

(30) Foreign Application Priority Data

May 27, 2017    (CN) .......................... 2017 1 0388431

(51) Int. Cl.
| | | |
|---|---|---|
| *H01L 29/08* | (2006.01) | |
| *H01L 27/32* | (2006.01) | |
| *H01L 51/00* | (2006.01) | |

(52) U.S. Cl.
CPC ...... *H01L 27/3279* (2013.01); *H01L 27/3262* (2013.01); *H01L 27/3272* (2013.01); *H01L 51/0097* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 8,432,095 B2* | 4/2013 | Pang | H01L 51/5203 313/483 |
| 8,610,645 B2* | 12/2013 | Koyama | G09G 3/3225 345/76 |
| 2003/0193056 A1* | 10/2003 | Takayama | G02F 1/136286 257/79 |
| 2005/0088086 A1* | 4/2005 | Park | H01L 27/3244 313/506 |
| 2016/0179229 A1* | 6/2016 | Ahn | G06F 3/041 345/173 |

* cited by examiner

*Primary Examiner* — Matthew E. Gordon
(74) *Attorney, Agent, or Firm* — Kilpatrick Townsend & Stockton LLP (57) ABSTRACT

The present application discloses a display panel and a display device. The display panel comprises a substrate, a power supply line layer and a power supply compensation film, wherein the power supply compensation film is arranged on the back surface of the substrate, the power supply line layer is arranged on the front surface of the substrate and comprises a first power supply line arranged in a first frame area and a second frame area, the power supply compensation film is electrically connected with the first power supply line, the sheet resistance of the power supply compensation film is smaller than that of the power supply line layer, and the first frame area and the second frame area are positioned in non-display areas on two opposite sides of a display area respectively.

19 Claims, 4 Drawing Sheets

DISPLAY PANEL INCLUDING POWER SUPPLY COMPENSATION FILM HAVING REDUCED SHEET RESISTANCE ARRANGED ON OPPOSITE SURFACE OF SUBSTRATE FROM POWER SUPPLY LINE LAYER

CROSS-REFERENCE TO RELATED APPLICATION

This application is related to and claims priority from Chinese Patent Application No. 201710388431.3, filed on May 27, 2017, entitled "Display Panel and Display Device," the entire disclosure of which is hereby incorporated by reference for all purposes.

TECHNICAL FIELD

The present application generally relates to the technical field of display, particularly to a display panel and a display device.

BACKGROUND

An OLED (Organic Light Emitting Diode), as a display device emitting light actively, has the advantages of being highly bright, fast responding, bendable, ultra-light and ultra-thin, dispensable of backlight, etc., has an important application in the technical field of display technology, and has particularly become the display device with the most potential for substituting a liquid crystal display.

Figure 1:
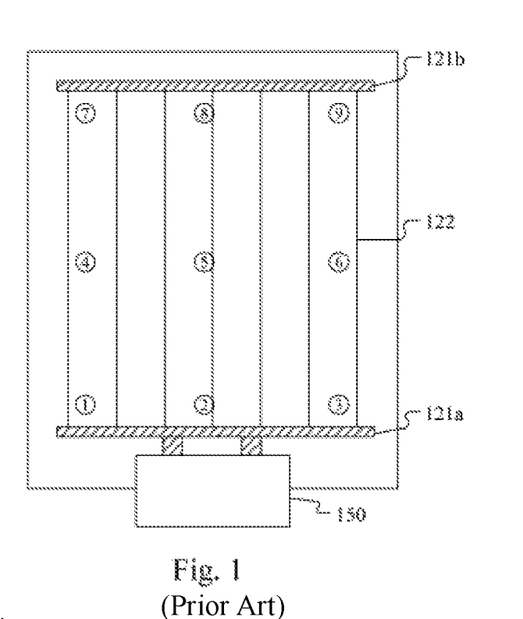
FIG. 1 shows a schematic diagram of an OLED display panel in the prior art.

A traditional OLED display panel provides power signals required for normal operation of an OLED device through a power supply line to realize picture display. FIG. 1 shows a schematic diagram of an OLED display panel used in the existing technology. A supply voltage is sequentially transferred to a first power supply line 121a, a second power supply line 122 and a first power supply line 121b through a flexible circuit board to enable subpixels on the display panel to emit light.

However, because the first power supply line 121a, the second power supply line 122 and the first power supply line 121b utilize thin films (for example, aluminum films), and have minuscule thickness (less than 1 μm, for example, 0.4 μm), the sheet resistance of the power supply lines is relatively large. Therefore, in the process of transferring the supply voltage from the first power supply line 121a (the side proximal to the flexible circuit board 150) to the first power supply line 121b (the side distal to the flexible circuit board 150) through the second power supply line 122, the loss caused by the second power supply line 122 results in an noticeable voltage drop between the first power supply lines 121a and 121b, thereby leading to the existence of visible brightness differences between a subpixel on the distal side of the flexible circuit board 150 and a subpixel on the proximal side of the flexible circuit board 150.

SUMMARY

In view of the above defects or shortcomings in the prior art, a display panel and a display device are expected to be provided to solve the technical problems in the prior art.

According to one aspect of the present application, a display panel is provided, including a substrate, a power supply line layer and a power supply compensation film, wherein the power supply compensation film is arranged on the back surface of the substrate, the power supply line layer is arranged on the front surface of the substrate, and the back surface of the substrate is a surface opposite to a light emitting surface of the display panel; the display panel is divided into a display area and a non-display area surrounding the display area, and the non-display area includes a first frame area and a second frame area on two opposite sides of the display area; the power supply line layer includes a first power supply line arranged in the first frame area and the second frame area, and a plurality of second power supply lines arranged in the display area, and the first power supply line is electrically connected with the second power supply lines; and the power supply compensation film is electrically connected with the first power supply line, and the sheet resistance of the power supply compensation film is smaller than that of the power supply line.

In some embodiments, the display panel further includes a conductive shielding film covering the back surface of the substrate and also being used as the power supply compensation film.

In some embodiments, the display panel further includes a flexible circuit board electrically connected with the first power supply line in the first frame area through a conductive adhesive.

In some embodiments, the power supply compensation film is electrically connected with the flexible circuit board through the conductive adhesive.

In some embodiments, the power supply compensation film is electrically connected with the first power supply line in the second frame area through the conductive adhesive.

In some embodiments, the conductive adhesive includes an anisotropic conductive film.

In some embodiments, the display panel further includes a plurality of conductive plugs arranged on the first power supply line and penetrating through the substrate to electrically connect the first power supply line with the power supply compensation film.

In some embodiments, the conductive plug includes a conductive silver paste.

In some embodiments, the display panel further includes a supporting protective film arranged on the back surface of the substrate and covering the power supply compensation film.

In some embodiments, the supporting protective film includes a polyester thin film.

In some embodiments, the display panel further includes a plurality of thin-film transistors, a plurality of capacitance metal layers and a plurality of reflecting electrodes in the display area, wherein the thin-film transistor includes a metal shading area, a gate electrode and a source/drain electrode; and one of the metal shading area, the gate electrode, the source/drain electrode and the reflecting electrode is manufactured in an identical patterning process as the power supply line layer.

In some embodiments, the material of the power supply compensation film includes at least one of: metal, graphene, carbon nano-tube and conductive polymer.

In some embodiments, the thickness of the power supply compensation film is greater than that of the power supply line layer.

In some embodiments, the sheet resistance $R_c$ of the power supply compensation film and the sheet resistance $R_p$ of the power supply line layer meet:

$$R_p : R_c \geq 10.$$

In some embodiments, the display panel further includes a driver chip arranged on the flexible circuit board.

In some embodiments, the display panel is an organic light-emitting display panel.

In some embodiments, the display panel is a flexible display panel.

According to another aspect of the present application, a display device is further provided, including the display panel as described above.

According to the display panel and display device provided by the present application, by setting the power supply compensation film electrically connected with the first power supply line on the back surface of the display panel and enabling the sheet resistance of the power supply compensation film to be smaller than that of the power supply line layer, the difference of voltages applied to the subpixels between the first frame area and the second frame area is reduced, and then the display with uniform brightness is achieved.

BRIEF DESCRIPTION OF THE DRAWINGS

Other features, objectives and advantages of the present application will become more apparent by reading a detailed description of the nonrestrictive embodiments made with reference to the following drawings.

DETAILED DESCRIPTION OF EMBODIMENTS

The present application will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 2A:
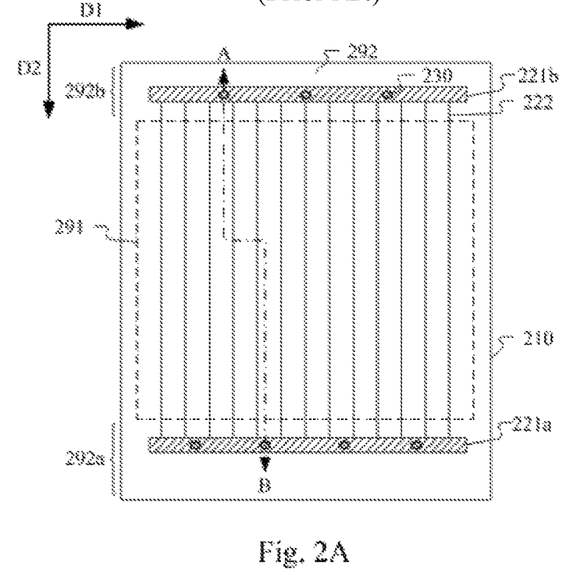
FIG. 2A shows a top view of the display panel of one embodiment of the present application.
Figure 2B:
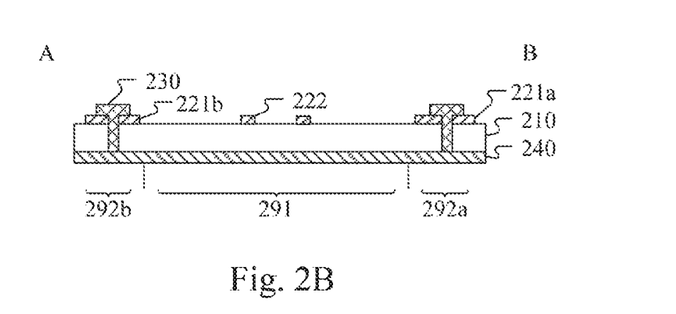
FIG. 2B is a section view of an edge line AB in FIG. 2A.

FIG. 2A shows a top view of the display panel in one embodiment of the present application, and FIG. 2B shows a section view of the edge line AB shown in FIG. 2A.

As shown in FIG. 2A and FIG. 2B, the display panel may include a substrate 210, a power supply line layer and a power supply compensation film 240, the power supply compensation film 240 may be positioned on the back surface of the substrate 210, and the power supply line layer may be positioned on the front surface of the substrate 210. Here, the back surface of the substrate 210 refers to a surface opposite to a light emitting surface of the display panel.

It can be seen from FIG. 2A that the display panel may be divided into a display area 291 and a non-display area 292 surrounding the display area 291, and the non-display area 292 may include a first frame area 292a and a second frame area 292b positioned on two opposite sides of the display area 291 respectively.

The power supply line layer may include first power supply lines 221a and 221b and a plurality of second power supply lines 222. Wherein, the first power supply line 221a may be arranged in the first frame area 292a, the first power supply trance 221b may be arranged in the second frame area 292b, and the second power supply lines 222 may be arranged in the display area 291.

The first power supply lines 221a and 221b may extend in a first direction D1, the second power supply lines 222 may extend in a second direction D2, and the first power supply line 221a may be electrically connected with the first power supply line 221b through the second power supply lines 222. Here, the first direction D1 and the second direction D2 intersect.

The power supply compensation film 240 may be electrically connected with the first power supply lines 221a and 221b, and the sheet resistance of the power supply compensation film 240 may be smaller than that of the power supply line layer.

The beneficial effects of the present embodiment are illustrated below in conjunction with FIG. 1.

According to the OLED display panel shown in FIG. 1, because of the resistance loss of the second power supply lines 122, there are obvious voltage differences between the first power supply line 121a close to one side of the flexible circuit board 150 and the first power supply line 121b far from one side of the flexible circuit board 150, so that there are also significant differences in the brightness of the subpixels on the two sides, as shown in Table 1.

TABLE 1

Relative brightness of subpixels at different positions

| Position | Sub-pixel | Relative brightness | Sub-pixel | Relative brightness | Sub-pixel | Relative brightness |
| --- | --- | --- | --- | --- | --- | --- |
| Near end | ① | 100.00% | ② | 95.00% | ③ | 94.34% |
| Middle | ④ | 93.90% | ⑤ | 90.94% | ⑥ | 88.97% |
| Near end | ⑦ | 90.49% | ⑧ | 88.53% | ⑨ | 87.29% |

Table 1 shows relative brightness values of the subpixels at different positions (for example, the maximum brightness of a white screen is 100%, and the minimum brightness of a black screen is 0) when an identical data voltage (e.g., 5V) is applied to the subpixels on the display panel. As shown in FIG. 1, the subpixels ①~③ are positioned in a pixel row of a near end (close to one side of the flexible circuit board 150) of the flexible circuit board 150, the subpixels ⑦~⑨ are positioned in a pixel row of a far end (far from one side of the flexible circuit board 150) of the flexible circuit board 150, and the subpixels ④~⑥ are positioned in a pixel raw between the far end and the near end of the flexible circuit board 150. In addition, the subpixels ①, ④ and ⑦ are in an identical column, the subpixels ②, ⑤ and ⑧ are in an identical column, and the subpixels ③, ⑥ and ⑨ are in an identical column.

It can be seen from Table 1 that from the near end of the flexible circuit board to the far end of the flexible circuit board, the relative brightness of the subpixels is gradually reduced (e.g., from 100% to 90.49%), and the relative brightness difference between the subpixel of the nearest end and the subpixel of the farthest end is close to 10% (9.51%).

However, in the present embodiment, because of the power supply compensation film 240 with a smaller sheet resistance (compared with the power supply line layer), from a calculation formula of the sheet resistance:

$$R = \frac{\rho}{d} \quad (1)$$

it can be concluded that $(\rho_c/d_c)<(\rho_p/d_p)$.

Wherein, $\rho$ is resistivity, d is film thickness, $\rho_p$ and $\rho_c$ are the resistivity of the second power supply line 222 and the power supply compensation film 240 respectively, and $d_p$ and $d_c$ are the film thickness of the second power supply line 222 and the power supply compensation film 240 respectively.

Moreover, because the power supply compensation film 240 may cover the back surface of the substrate 210, on a cross section perpendicular to an extension direction (i.e., the second direction D2) of the second power supply line 222, the width of the power supply compensation film 240 in the first direction D1 may be far greater than that of the second power supply line 222 in the first direction D1, and from a calculation formula of resistance:

$$R = \frac{\rho l}{S} = \frac{\rho l}{wd} \quad (2)$$

It can be seen that between the first power supply lines 221a and the 221b, the resistance value of the power supply compensation film 140 may be far smaller than that of the second power supply line 222, namely $(\rho_c \, l_c/w_c \, d_c)<(\rho_p \, l_p/w_p \, d_p)$.

Wherein, l represents the distance between the first power supply lines 221a and the 221b, S represents the area of the cross section perpendicular to the second direction D2, w represents the width (perpendicular to a film thickness direction d) of the cross section in the first direction D1, $l_p$ and $l_c$ represent the lengths of the second power supply line 222 and the power supply compensation film 240 in the second direction D2 respectively, and $w_p$ and $w_c$ represent the widths of the second power supply line 222 and the power supply compensation film 240 in the first direction D1 respectively. Here, $l_p = l_c$, and $w_p < w_c$.

It can be seen from the above that the power supply compensation film 240 reduces the resistance value between the first power supply lines 221a and 221b, so that the voltage difference between the first power supply lines 221a and 221b is reduced to reduce the brightness difference between the subpixels ①~③ and the subpixels ⑦~⑨, for example, the relative brightness of the subpixels ⑦~⑨ may be 95%, 94% and 93.5% respectively, namely the brightness uniformity of display is improved.

In the present embodiment, by setting the power supply compensation film with the sheet resistance smaller than that of the power supply line layer on the back surface of the display panel, and reducing the voltage difference of the subpixels between the first frame area and the second frame area, the brightness non-uniformity of each subpixel due to the impedance of the power supply lines is reduced, and then the display with uniform brightness is achieved.

It should be noted that, although Table 1 shows that there is also brightness difference among the subpixels ①~③, for example, the brightness difference between the subpixel ① and the subpixel ③ is 5.66%, this difference is caused by differences in pixels themselves (e.g., process errors, etc.) rather than by the impedance of the power supply lines, therefore, it is not further illustrated in the present embodiment.

Figure 3A:
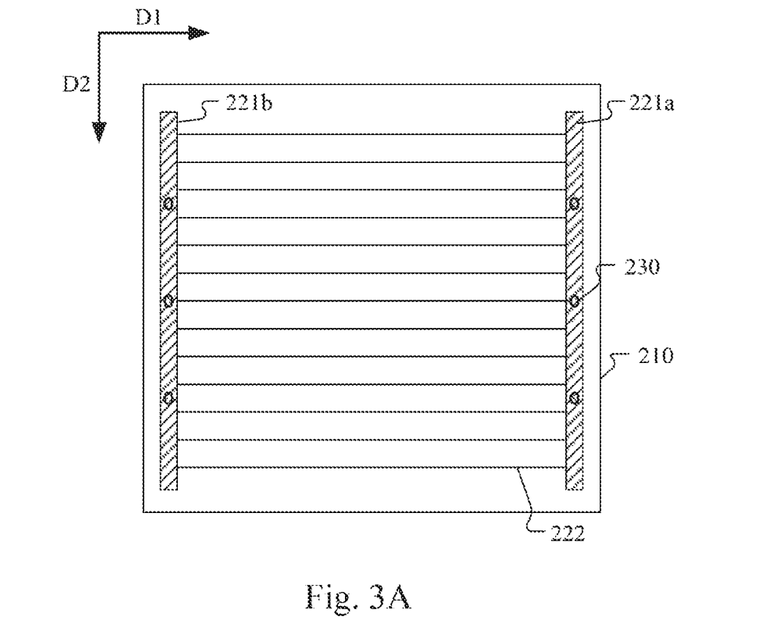
FIG. 3A and FIG. 3B show a schematic diagram of another implementation of the embodiment shown in FIG. 2A.

In addition, although FIG. 2A shows that the first power supply lines 221a and 221b extend in the first direction D1 and the second power supply line 222 extends in the second direction D2, it is only schematic. It should be appreciated that, the first power supply lines 221a and 221b may extend in the second direction D2 and the second power supply line 222 may extend in the first direction D1, as shown in FIG. 3A.

In one embodiment, the resistivity $\rho_c$ of the power supply compensation film 240 is smaller than the resistivity $\rho_p$ of the power supply line layer.

It is favorable for realizing the power supply compensation film 240 with a small sheet resistance by utilizing a conducting material with the resistivity smaller than that of the power supply line layer. For example, when the power supply line layer utilizes Al, the power supply compensation film 240 may utilize Cu, Ag or another material.

In one embodiment, the film thickness $d_c$ of the power supply compensation film is greater than the film thickness $d_p$ of the power supply line layer.

The power supply compensation film 240 with a small sheet resistance may also be realized by increasing the film thickness $d_c$ of the power supply compensation film 240. For example, when the film thickness $d_p$ is 0.4 μm, the film thickness $d_c$ of the power supply compensation film 240 may be greater than 0.4 μm.

In one embodiment, the sheet resistance $R_c$ of the power supply compensation film 240 and the sheet resistance $R_p$ of the power supply line layer meet: $R_p:R_c \geq 10$. In this way, it can be ensured that there is a small brightness difference (e.g., not more than 5%) between the subpixel close to one side of the first power supply line 221a (far from an input end of a power supply signal) and the subpixel close to one side of the first power supply line 221b (close to the input end of the power supply signal).

It should be appreciated that, in order to ensure that $R_p:R_c \geq 10$, the resistivity $\rho_c$ of the power supply compensation film 240 may be reduced and/or the film thickness $d_c$ of the power supply compensation film may be increased.

In one embodiment, the display panel may further include a conductive shielding film covering the back surface of the substrate 210, and a direct current signal (e.g., earth connection) may be applied to the conducting shielding film to shield interference of external signals to the display panel.

For example, for the flexible display panel, due to the thin thickness of the display panel, a device on the display panel is interfered by the external signals very easily, resulting in abnormal display. The interference from the external signals may be effectively shielded by setting the conductive shielding film, which is favorable for stable display.

The conductive shielding film usually may be made of a metal film, for example, a copper film, an aluminum film, and the like, and may also be made of other materials with good conductivity, for example, graphene, a carbon nanotube, a conductive polymer, and the like.

In one embodiment, the conductive shielding film is also used as the power supply compensation film 240.

The advantages of reusing the conductive shielding film as the power supply compensation film 240 are described below.

Firstly, the power supply compensation film 240 is not required to be manufactured separately, so that the manufacturing process is simplified, and the production cost is reduced.

Secondly, the resistance value between the first power supply lines 221a and 221b may be greatly reduced.

Due to the limitation of technology and process conditions, the thickness of conductive shielding film is generally over 0.1 mm, and taking a copper film (the resistivity of copper is $1.75*10^{-8}$ $\Omega$m) with the thickness of 0.1 mm as an example, it can be calculated that the sheet resistance $R_c$ of the conductive shielding film is $1.75*10^{-4}\Omega$. But the power supply line layer is usually thin (the thickness is smaller than 1 μm), and taking an aluminum film (the resistivity of aluminum is $2.83*10^{-8}$ $\Omega$m) with the thickness of 1 μm as an example, it can be calculated that the sheet resistance $R_p$ of the power supply line layer is $2.83*10^{-2}\Omega$.

In other words, the sheet resistance $R_c$ of the conductive shielding film is less than 1/160 of the sheet resistance $R_p$ of the power supply line layer, thus, the resistance value between the first power supply lines 221a and 221b may be greatly reduced by reusing the conductive shielding film as the power supply compensation film 240.

In addition, using the conductive shielding film as the power supply compensation film 240 also has the advantages that, because the thickness of the conductive shielding film is at least 100 times that of the power supply line layer, the conductive shielding film/power supply compensation film 140 may be made of a high-resistivity material with a low cost (relative to the power supply line layer) to further reduce the production cost of the display panel.

Although it is exemplified that the thickness of the conductive shielding film 240 is not less than 0.1 mm, the present example is not limited to this. It should be appreciated that, with the development of technology and the improvement of production process, the film thickness of the conductive shielding film 240 may be less than 0.1 mm as long as it is greater than the film thickness of the power supply line layer, which can be set by those skilled in the art according to needs of an actual application scenario.

In one embodiment, the display panel may be an organic light-emitting display panel.

When the display panel is an organic light-emitting display panel, the display panel may further include an organic light-emitting diode which may include a cathode, an anode, and an electron injection layer, an electron transport layer, a light emitting layer, a hole transport layer and a hole injection layer between the cathode and the anode. When a driving voltage is applied to the anode and the cathode, electrons from the electron injection layer and holes from the hole injection layer are combined together to form excitons on the light emitting layer, and the excitons jump from a ground state to a excitation state to emit light.

In one embodiment, the display panel may be a flexible display panel.

When the display panel is a flexible display panel, the substrate 210 may be made of a flexible material (e.g., a plastic prepared from polycarbonate and polyarylester), so that the display panel is bendable. In this case, various layers of devices including the power supply line layer and the like may be directly formed on the flexible substrate 210, or various layers of devices including the power supply line layer and the like may be formed on a rigid substrate (with a separation layer) first, and then are separated from the rigid substrate and transposed to the flexible substrate 210.

In addition, in order to protect and support the display panel, a supporting protective film may be further arranged.

Figure 3B:
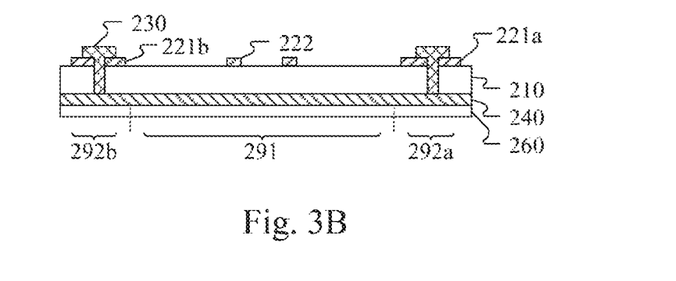

As shown in FIG. 3B, the display panel may further include a supporting protective film 260 which may be arranged on the back surface of the substrate 210 and cover the power supply compensation film 240.

The supporting protective film 260 may be a high-polymer plastic film, for example, a polyester thin film.

By setting the supporting protective film 260, the display panel may be supported, and the power supply compensation film 240 is avoided from being damaged by an external force.

It should be understood by those skilled in the art that the display panel of the present embodiment may further include some other known structures, for example, a thin-film transistor, a data line, a scanning line (not shown) and the like arranged on the substrate 210. In order not to obscure the focus of the present application, these known structures will no longer be described in detail.

The first power supply lines 221a and 221b and the power supply compensation film 240 may be electrically connected with each other by punching holes.

In one embodiment, the display panel further includes a plurality of conductive plugs 230 arranged on the first power supply lines 221a and 221b and penetrating through the substrate 210 to electrically connect the first power supply lines 221a and 221b with the power supply compensation film 240.

The conductive plug may include a conducting material with good conductivity, for example, a conductive silver paste. The conductive silver paste is a sticky paste of a mechanical mixture consisting of micro-particles of metallic silver with a high purity (e.g., 99.9%), an adhesive, a solvent, and an auxiliary agent.

By setting the conductive plugs 230, a power supply signal is transmitted from the first power supply line 221a to the first power supply line 221b through the power supply compensation film 240 and then transmitted to subpixels, thereby reducing the brightness difference among the subpixels.

Figure 4A:
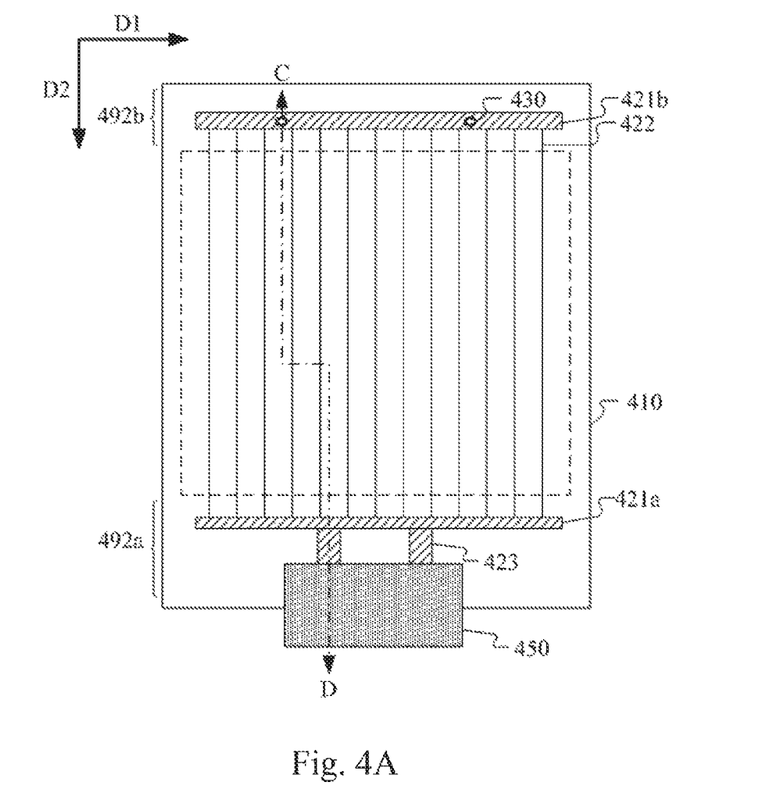
FIG. 4A shows a top view of the display panel of another embodiment of the present application.
Figure 4B:
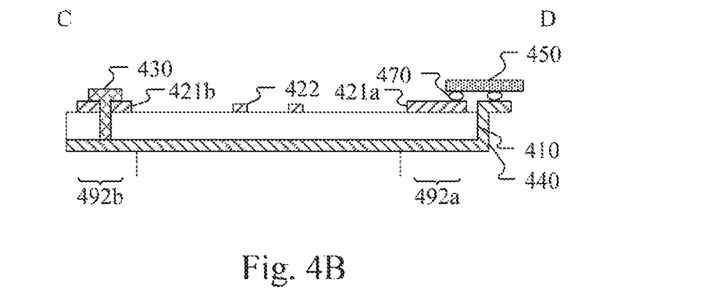
FIG. 4B is a section view of an edge line CD of FIG. 4A.

Continue to refer to FIG. 4A and FIG. 4B, FIG. 4A shows a top view of the display panel in another embodiment of the present application, and FIG. 4B shows a section view of the edge line CD shown in FIG. 4A.

Similar to the display panel shown in FIG. 2A and FIG. 2B, the display panel in the present embodiment may also include a substrate 410, first power supply lines 421a/421b, a second power supply line 422 and a power supply compensation film 440, and the first power supply line 421b of a second frame area 492b may also be electrically connected with the power supply compensation film 440 through a conductive plug 430.

Unlike the display panel shown in FIG. 2A and FIG. 2B, as shown in FIG. 4A and FIG. 4B, the display panel in the present embodiment further includes a flexible circuit board 450 for providing signals required by work of the display panel. The flexible circuit board 450 is electrically connected with the first power supply line 421a in the first frame area 492a through a conductive adhesive 470, and the power supply compensation film 440 is laminated to the flexible circuit board 450 and is electrically connected with the flexible circuit board through the conductive adhesive 470. In other words, the first power supply line 421a and the power supply compensation film 440 are electrically connected with the flexible circuit board 450 directly to receive external power supply signals.

In the present embodiment, by setting the power supply compensation film and reducing the voltage difference between the first frame area and the second frame area, display with uniform brightness is realized, and because it is not necessary to punch a hole in the first frame area (usually may be used as a fanout area), the wiring of the first frame area is simplified.

The conductive adhesive generally is a high-polymer conducting material with conductivity and viscosity formed by adding resin and a curing agent into a conductive filler and then performing curing, and can be classified as an anisotropic conductive adhesive and an isotropic conducive adhesive.

In one embodiment, the conductive adhesive 470 includes an anisotropic conductive adhesives film (ACF).

The flexible circuit board 450 may include a plurality of signal output terminals and utilizes the ACF as the conductive adhesive 470, so that short-circuiting between adjacent output terminals of flexible circuit board 450 may be avoided.

In one embodiment, the display panel further includes a driver chip (not shown) on the flexible circuit board 450 to provide signals to the terminals of the flexible circuit board 450.

In addition, the power supply line layer may further include a third power supply line 423 arranged in the first frame area 492a and extending in a second direction from the first power supply line 421a, and the third power supply line 423 is electrically connected with the flexible circuit board 450 through the conductive adhesive 470.

Figure 5:
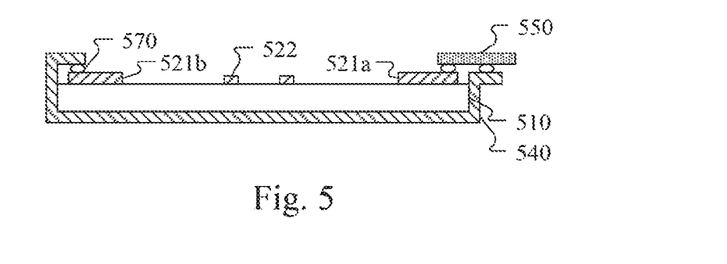
FIG. 5 shows a section view of the display panel of another embodiment of the present application.

Continue to refer to FIG. 5, it shows a section view of the display panel of another embodiment of the present application.

Similar to the embodiment shown in FIG. 4A and FIG. 4B, the display panel in the present embodiment may also include a substrate 510, first power supply lines 521a/521b, a second power supply line 522, a power supply compensation film 540 and a flexible circuit board 550, and the flexible circuit board 550 may also be electrically connected with the first power supply line 521a and the power supply compensation film 540 through the conductive adhesive 570.

Unlike the embodiment shown in FIG. 4A and FIG. 4B, as shown in FIG. 5, the power supply compensation film 540 in the present embodiment is laminated to the second power supply line 521b and is electrically connected with the second power supply line 521b through the conductive adhesive 570.

In the present embodiment, by setting the power supply compensation film and reducing the voltage difference between the first frame area and the second frame area, display with uniform brightness is realized, and because it is not necessary to punch holes in the first frame area and the second frame area, the process flow is reduced, and the wiring of the first frame area and the second frame area is simplified.

Figure 6:
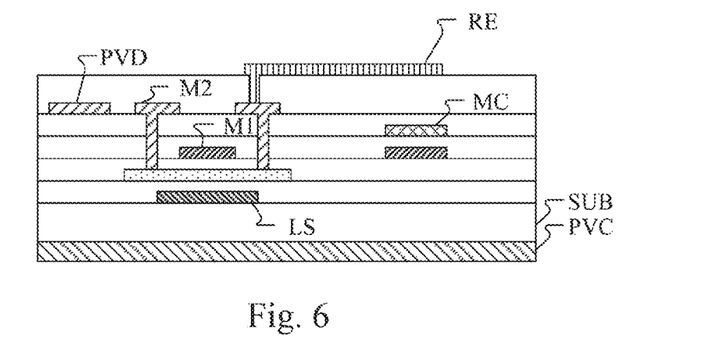
FIG. 6 shows a schematic diagram of the display panel of another embodiment of the present application.

Continue to refer to FIG. 6, it shows a schematic diagram of the display panel of another embodiment of the present application.

As shown in FIG. 6, the display panel in the present embodiment may also include the power supply line layer PVD and the power supply compensation layer PVC as mentioned above.

In addition, the display panel may further include a plurality of thin-film transistors, a plurality of capacitance metal layers MC and a plurality of reflecting electrodes RE arranged on the substrate SUB, and the thin-film transistor may include a gate electrode M1, a source/drain electrode M2 and a metal shading area LS. The source/drain electrode M2 and the power supply line layer PVD are in an identical layer and manufactured in an identical patterning process.

In the present embodiment, by setting the power supply compensation film, the display with uniform brightness is realized, and because the power supply line layer and the source/drain electrode are manufactured in an identical patterning process, the manufacturing process of the display panel is simplified, and the production cost is reduced.

Although FIG. 6 shows that the power supply line layer PVD and the source/drain electrode M2 are manufactured in an identical patterning process, it is only schematic. It should be appreciated that the power supply line layer PVD may also be in an identical layer and manufactured in an identical patterning process with any one of the reflecting electrode RE, the capacitance metal layer MC, the gate electrode M1 and the metal shading area LS, which may be set by those skilled in the art according to needs of an actual application scenario.

Figure 7:
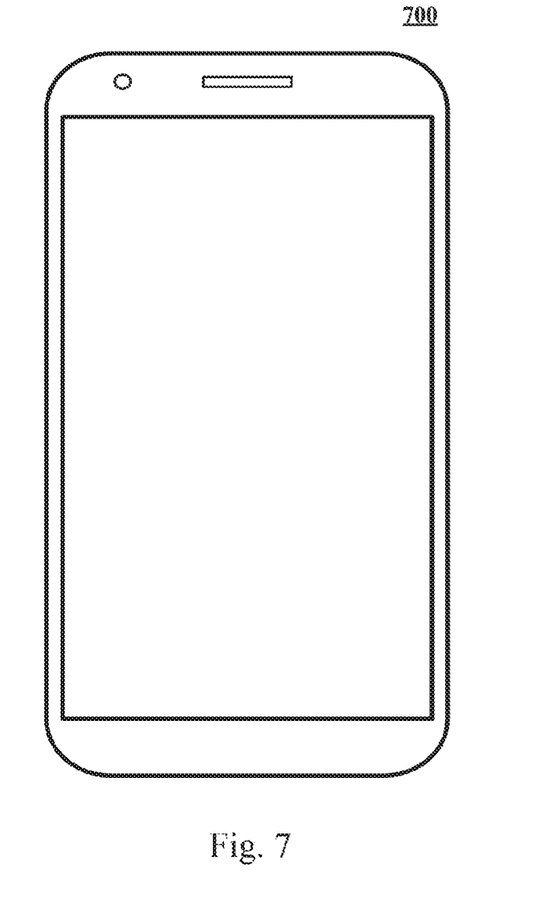
FIG. 7 shows a schematic structure diagram of an embodiment of the display device of the present application.

The present application further discloses a display device, as shown in FIG. 7. Wherein, the display device 700 may include the display panel described above. It should be understood by those skilled in the art that the display device may further include some other known structures in addition to the display panel described above. In order not to obscure the focus of the present application, these known structures will no longer be further described.

The display device of the present application may be any device containing the display panel described above, including but not limited to, as shown in FIG. 7, a cellular mobile phone 700, a tablet computer, a computer display, a display applied to a smart wearable device, a display device applied to means of transportation, such as an automobile, and the like. As long as a display device contains the structure of the display panel disclosed by the present application, it is deemed to fall within the scope of protection of the present application.

The display panel and display device provided by the present application reduce the brightness differences between the subpixels, thereby realizing display with uniform brightness.

The above description only provides an explanation of embodiments of the present application and the technical principles used. It should be appreciated by those skilled in the art that the inventive scope of the present application is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present application are examples.

What is claimed is:
1. A display panel, comprising:
a substrate, a power supply line layer and a power supply compensation film, wherein the power supply compensation film is arranged on a back surface of the substrate, the power supply line layer is arranged on a front surface of the substrate, and the back surface of the substrate is a surface opposite to a light emitting surface of the display panel;
the display panel comprises:
a display area and a non-display area surrounding the display area, and the non-display area comprises a first frame area and a second frame area positioned on two opposite sides of the display area;

the power supply line layer comprises:

a first power supply line arranged in the first frame area and the second frame area, and a plurality of second power supply lines arranged in the display area, and the first power supply line is electrically connected with the plurality of second power supply lines; and the power supply compensation film is electrically connected with the first power supply line, and a sheet resistance of the power supply compensation film is smaller than a sheet resistance of the power supply line layer.

2. The display panel according to claim 1, further comprising a conductive shielding film covering the back surface of the substrate and dual-used as the power supply compensation film.

3. The display panel according to claim 1, further comprising a flexible circuit board electrically connected with the first power supply line in the first frame area through a conductive adhesive.

4. The display panel according to claim 3, wherein the power supply compensation film is electrically connected with the flexible circuit board through the conductive adhesive.

5. The display panel according to claim 3, wherein the power supply compensation film is electrically connected with the first power supply line in the second frame area through the conductive adhesive.

6. The display panel according to claim 3, wherein the conductive adhesive comprises an anisotropic conductive film.

7. The display panel according to claim 1, further comprising a plurality of conductive plugs arranged on the first power supply line and penetrating through the substrate to electrically connect the first power supply line with the power supply compensation film.

8. The display panel according to claim 7, wherein the conductive plugs comprise a conductive silver paste.

9. The display panel according to claim 1, further comprising a supporting protective film arranged on the back surface of the substrate and covering the power supply compensation film.

10. The display panel according to claim 9, wherein the supporting protective film comprises a polyester thin film.

11. The display panel according to claim 1, further comprising:

a plurality of thin-film transistors, a plurality of capacitance metal layers and a plurality of reflecting electrodes in the display area, wherein the thin-film transistor comprises a metal shading area, a gate electrode and a source/drain electrode; and one of the metal shading area, the gate electrode, the capacitance metal layer, the source/drain electrode and the reflecting electrode is manufactured in an identical patterning process as the power supply line layer.

12. The display panel according to claim 1, wherein a material of the power supply compensation film comprises at least one of:

metal, graphene, carbon nano-tube, and conductive polymer.

13. The display panel according to claim 1, wherein a thickness of the power supply compensation film is greater than that of the power supply line layer.

14. The display panel according to claim 1, wherein a sheet resistance $R_c$ of the power supply compensation film and a sheet resistance $R_p$ of the power supply line layer meet:

$R_p:R_c \geq 10$.

15. The display panel according to claim 1, wherein the display panel is an organic light-emitting display panel.

16. The display panel according to claim 1, wherein the display panel is a flexible display panel.

17. A display device, comprising:

a display panel, the display panel includes a substrate, a power supply line layer and a power supply compensation film, wherein the power supply compensation film is arranged on a back surface of the substrate, the power supply line layer is arranged on a front surface of the substrate, and the back surface of the substrate is a surface opposite to a light emitting surface of the display panel;

the display panel comprises:

a display area and a non-display area surrounding the display area, and the non-display area comprises a first frame area and a second frame area positioned on two opposite sides of the display area;

the power supply line layer comprises:

a first power supply line arranged in the first frame area and the second frame area, and a plurality of second power supply lines arranged in the display area, and the first power supply line is electrically connected with the plurality of second power supply lines; and the power supply compensation film is electrically connected with the first power supply line, and a sheet resistance of the power supply compensation film is smaller than a sheet resistance of the power supply line layer.

18. The display device according to claim 17, the display panel further comprising a conductive shielding film covering the back surface of the substrate, wherein the conductive shielding further provides for the power supply compensation film.

19. The display device according to claim 17, wherein a sheet resistance $R_c$ of the power supply compensation film and a sheet resistance $R_p$ of the power supply line layer meet:

$R_p:R_c \geq 10$.

* * * * *